United States Patent
Thompson et al.

(10) Patent No.: US 6,934,208 B2
(45) Date of Patent: Aug. 23, 2005

(54) APPARATUS AND METHOD FOR A CURRENT LIMITING BLEEDER DEVICE SHARED BY COLUMNS OF DIFFERENT MEMORY ARRAYS

(75) Inventors: J. Wayne Thompson, Boise, ID (US); George B. Raad, Boise, ID (US); Howard C. Kirsch, Eagle, ID (US)

(73) Assignee: Boise Technology, Inc., Boise, ID (US)

( * ) Notice: Subject to any disclaimer, the term of this patent is extended or adjusted under 35 U.S.C. 154(b) by 331 days.

(21) Appl. No.: 10/309,572

(22) Filed: Dec. 3, 2002

(65) Prior Publication Data

US 2004/0105333 A1 Jun. 3, 2004

(51) Int. Cl.$^7$ .............................................. G11C 7/00
(52) U.S. Cl. ........................ 365/203; 365/206; 365/205
(58) Field of Search ................................ 365/203, 205, 365/206, 207, 51, 52, 63

(56) References Cited

U.S. PATENT DOCUMENTS

| | | | |
|---|---|---|---|
| 5,235,550 A | 8/1993 | Zagar | 365/226 |
| 5,499,211 A * | 3/1996 | Kirihata et al. | 365/203 |
| RE35,825 E | 6/1998 | Zagar | 365/226 |
| 5,896,334 A | 4/1999 | Casper et al. | 365/202 |
| 6,078,538 A | 6/2000 | Ma et al. | 365/226 |
| 6,144,599 A * | 11/2000 | Akita et al. | 365/203 |
| 6,181,618 B1 * | 1/2001 | Inaba et al. | 365/203 |
| 6,333,882 B1 | 12/2001 | Merritt et al. | 365/203 |
| 6,356,492 B1 | 3/2002 | Raad | 365/202 |
| 6,426,908 B1 | 7/2002 | Hidaka | 365/222 |
| 2003/0235102 A1 | 12/2003 | Joo | 365/207 |
| 2004/0105333 A1 | 6/2004 | Thompson et al. | 365/203 |

OTHER PUBLICATIONS

Kirihata, T. et al., "Fault–Tolerant Designs for 256 Mb DRAM", IEEE Journal of Solid–State Circuits, vol. 31, No. 4, Apr. 1996, pp. 558–566.

* cited by examiner

*Primary Examiner*—Gene N. Auduong
(74) *Attorney, Agent, or Firm*—Dorsey & Whitney LLP

(57) ABSTRACT

Apparatus and method for a current limiting bleeder device that is shared between columns of different memory arrays and limits a current load on a voltage supply to prevent failure of an otherwise repairable memory device. The memory device includes first and second memory arrays having memory cells arranged in rows and columns where each of the columns of the first and second memory arrays have a equilibration circuit to precharge the respective column. A bleeder device is coupled to a precharge voltage supply and further coupled to at least one equilibration circuit of a column in the first memory array and to at least one equilibration circuit of a column in the second memory array to limit the current drawn by the equilibration circuits from the precharge voltage supply.

41 Claims, 3 Drawing Sheets

APPARATUS AND METHOD FOR A CURRENT LIMITING BLEEDER DEVICE SHARED BY COLUMNS OF DIFFERENT MEMORY ARRAYS

TECHNICAL FIELD

The present invention relates generally to the field of computer memories, and more particularly, to an apparatus and method for sharing a current limiting device between columns of different memory arrays, thus, providing flexible layout options for high density DRAM architectures.

BACKGROUND OF THE INVENTION

As is generally known, conventional dynamic random access memory (DRAM) devices include memory arrays having memory cells arranged in rows and columns. Each of the memory cells are typically formed from a capacitor, which acts as the storage node, and an access device that couples the capacitor to a sense node at which the charge state of the capacitor is sensed and amplified by a sense amplifier. The sense node is typically represented by a digit line. The digit lines are grouped in complementary pairs that are coupled to a respective sense amplifier. One pair of digit lines represents a column of memory cells. The access devices for a row of memory cells are coupled to a word line, which when activated, couple the memory cells to the respective digit line.

As part of the process in accessing the memory cells, the pairs of digit lines are "precharged" by a precharge circuit in preparation for a memory cell access operation. Precharging equilibrates the voltage of the pairs of digit lines and sets the voltage of the digit lines to a precharge voltage level, which is generally one-half of the power supply voltage for the memory device. During the precharge operation, all of the word lines are grounded to ensure that the charge state stored by the memory cell capacitors are not altered. When the memory cells are accessed, a word line is activated to couple the memory cells of the row to the respective digit lines. Only one row of an array of memory cells is activated at a time, with the word lines of the other memory cells grounded to ensure that the access devices remain inactive. When coupled to the respective digit lines, the capacitors of the activated row of memory cells alter the voltage of the digit lines from the precharge voltage level. The change in voltage is detected by the sense amplifier coupled to the respective digit line and amplified.

As also generally known, memory devices, such as DRAMs, include redundant rows and columns of memory to replace defective rows and columns of memory. That is, the memory addresses for defective memory locations are remapped to the redundant memory. Thus, although a memory device may include some defective memory, it can nevertheless operate normally through the use of the redundant memory. For example, a well known failure mode occurs when a digit line is short circuited to a word line. As previously discussed, during a memory access operation, all of the word lines except for the row of memory cells being accessed are coupled to ground. Where a digit line and word line are short circuited, the digit line will be held to a ground potential. As a result, the low voltage level will be sensed by the sense amplifier and amplified, regardless of the voltage level of any of the memory cells of that column. Additionally, the additional load on the word line that is short circuited to the digit line may be such that the word line cannot achieve a sufficient voltage level in the region of the short circuit to couple the memory cells to the respective digit line. As a result, the memory cells of the shorted row in the vicinity of the short circuit are also defective. The defective column and row results in a failure pattern that produces a "cross" of defective memory cells. In many cases, assuming that the number of cross failures does not exceed the number of available rows and columns of redundant memory, the memory addresses of the defective memory cells can be remapped so that the memory device can be operated normally by using the redundant memory.

Having a sufficient amount of redundant memory, however, does not ensure that a memory device having cross failures can operate normally. Although the defective columns and rows of memory can be replaced with redundant rows and columns of memory, the short circuit is still present. As previously discussed, during a stand-by state, the word lines are grounded and the digit lines are balanced and precharged to a precharge voltage level. Consequently, a short circuit between a digit line and a word line provides a direct path from the precharge voltage supply to ground, and thus, places an unusually high current load on the precharge voltage supply. Where the additional current load exceeds the current drive capability of the precharge voltage supply, the voltage level of the precharge voltage supply may be reduced to below an acceptable precharge voltage level. As a result, digit lines in addition to the shorted digit line may not be sufficiently precharged, causing the memory cells of an otherwise functional digit line to fail. Even in less extreme cases where otherwise functional digit lines do not fail, or those failing can be replaced by redundant columns of memory, the additional current load caused by a digit line being short circuited to a word line results in greater power consumption.

One conventional approach taken to limit the current load on a precharge voltage supply in the event of a cross failure is to couple a diode-coupled depletion n-channel MOS (NMOS) transistor between the precharge voltage supply and the precharge circuit of a column of memory. The depletion NMOS transistor behaves as a current limiting device designed to limit the maximum current load on the precharge voltage supply to an acceptable level that allows for sufficient precharging of the digit lines. A more detailed description of this conventional approach can be found in Kirihata et al., "Fault-Tolerant Designs for 256 Mb DRAM," *IEEE J. Solid-State Circuits*, vol. 31, pp. 558–66, April 1996. Although the previously described approach is effective, formation of the depletion NMOS requires an additional depletion implant step as part of the fabrication process. Adding process steps is generally considered undesirable because it necessarily results in reduced fabrication throughput.

Therefore, there is a need for an alternative approach to limiting the current load on a voltage supply in the event an unusually high current load is caused by an otherwise repairable defect.

SUMMARY OF THE INVENTION

The present invention is directed to a memory device having a current limiting bleeder device that is shared between columns of different memory arrays that limits a current load on a voltage supply to prevent failure of an otherwise repairable device. The memory device includes first and second memory arrays having memory cells arranged in rows and columns. Each of the columns of the first and second memory arrays is coupled to an equilibration circuit to precharge the columns. Further included in the memory device is a bleeder device coupled to a precharge voltage supply and further coupled to at least one equilibration circuit of the first memory array and to at least one equilibration circuit of the second memory array. The bleeder device limits the current drawn by the equilibration circuits from the precharge voltage supply. In one aspect of the present invention, a sense amplifier region is disposed between the first and second memory arrays. Sense amplifiers are formed in the sense amplifier region, as well as having the bleeder devices formed therein. Each of the sense amplifiers is coupled to a column from the first memory array and a column of the second memory array.

DETAILED DESCRIPTION OF THE INVENTION

Embodiments of the present invention are directed to memory device having a current limiting bleeder device shared between columns of different memory arrays for limiting the current load on a voltage supply in the event an unusually high current load results from a repairable defect. In the following detailed description of exemplary embodiments of the invention, reference is made to the accompanying drawings, which form a part hereof, and in which are shown, by way of illustration, specific exemplary embodiments in which the invention may be practiced. These embodiments are described in sufficient detail to enable those skilled in the art to practice the invention. However, it will be clear to one skilled in the art that the invention may still be practiced without these particular details. In other instances, well-known circuits, control signals, timing protocols, and software operations have not been shown in detail in order to avoid unnecessarily obscuring the invention. Other embodiments may be utilized and modifications may be made without departing from the spirit or scope of the present invention. The following detailed description is, therefore, not to be taken in a limiting sense, and the scope of the present invention is defined only by the appended claims.

Figure 1:
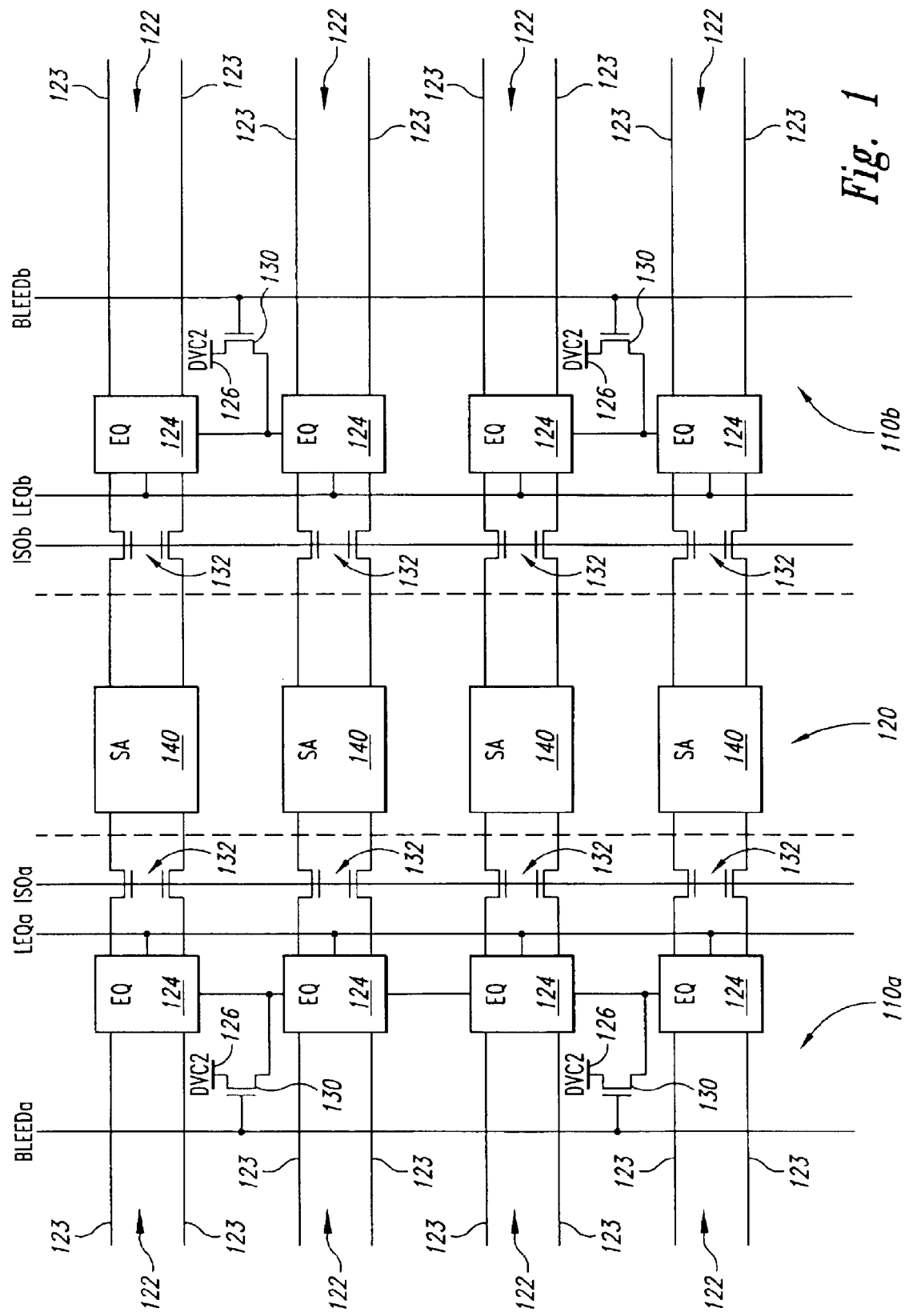
FIG. 1 is a simplified block diagram showing portions of a sense amplifier region and memory array regions of a memory device.

FIG. 1 illustrates a sense amplifier region 120 positioned between memory array regions 110a, 110b. It will be appreciated that FIG. 1 is a simplified block diagram, and details have been omitted in order to avoid obscuring the present invention. However, the omitted details are such that those of ordinary skill in the art would nevertheless be able to practice the invention based on the description provided herein.

Generally, in each of the memory array regions 110a, 110b, memory cells (not shown) are arranged into rows of word lines (not shown) and columns 122 of digit lines 123. As shown in FIG. 1, each of the columns 122 of memory cells are formed from a pair of complementary digit lines 123. An equilibration circuit 124 is coupled to each pair of digit lines 123 and "precharges" the respective digit lines 123 in preparation for an access operation, as is well understood in the art. Typically, the equilibration circuits 124 are activated by an activation signal LEQa, LEQb, at which time, the digit lines 123 of a column 122 of memory cells are coupled together to balance the voltage of the pair of digit lines 123, as well as being coupled to a DVC2 voltage supply 126 to charge the digit lines 123 of a column 122 to the precharge voltage level. The voltage level of the DVC2 voltage supply 126 is generally one-half of the power supply voltage for the memory device, and can be generated by conventional voltage generator circuits well known in the art. The DVC2 voltage supply 126 is provided to each equilibration circuit 124 through a relatively long n-channel MOS (NMOS) bleeder device 130 formed in the respective memory array region 110a, 110b. Drains of the NMOS bleeder devices 130 are coupled to the DVC2 voltage supply 126, and sources are coupled to at least one equilibration circuit 124. Gates of the NMOS bleeder devices 130 for a memory array region 110a, 110b are coupled to a respective control line that provides activation signals BLEEDa, BLEEDb that are coordinated with the LEQa, LEQb signals to precharge the digit lines 123 to the voltage level of the DVC2 voltage supply 126. As will be explained in more detail below, the NMOS bleeder devices 130 are also used to limit the current load on the DVC2 voltage supply 126 in the event a digit line 123 is short circuited to a word line.

In addition to the equilibration circuit 124, the digit lines 123 of a column 122 are coupled to a respective pair of isolation transistors 132. The isolation transistors 132 selectively couple a column 122 to a respective sense amplifier 140 when activated by an activation signal ISOa, ISOb.

As shown in FIG. 1, the sense amplifiers 140 are typically formed in the sense amplifier region 120 disposed between the two memory array regions 110a, 110b. The isolation transistors 132 allow for columns 122 of the two different memory array regions 110a, 110b to share one sense amplifier 140. That is, when accessing the memory cells of either the memory array regions 110a or 110b, the respective isolation transistors 132 of that memory array region are activated in order to couple the columns 122 to the sense amplifiers 140. The isolation transistors 132 of the other memory array region remain inactive to isolate the columns 122 from the respective sense amplifier 140.

As previously mentioned, the NMOS bleeder devices 130 are relatively long channel transistors that limit the current drawn from the DVC2 voltage supply 126 in the event a digit line 123 is shorted to a word line. As previously explained, during a stand-by state, the word lines of a memory array are grounded and the digit lines 123 are precharged to the voltage level of the DVC2 voltage generator 126. Consequently, while the equilibration circuits 124 are activated, the DVC2 voltage supply 126 is short circuited to ground through a digit line 123 that is short circuited to a word line. The NMOS bleeder devices 130, which are also activated during the stand-by state by the active BLEEDa and BLEEDb signals, behave as load devices to limit the current that sinks to ground in the event a digit line 123 is short circuited to a word line. Although the NMOS bleeder device 130 acts to limit the current to some degree, the current through the NMOS bleeder devices 130 will increase as the square of the voltage since both the gate-source voltage (i.e., the voltage differential between the BLEED signal and the decreasing voltage of the digit line 123) and drain-source voltage (i.e., the voltage difference between the voltage of the DVC2 voltage supply 126 and the decreasing voltage of the digit line 123) increase as the voltage of a digit line 123 is pulled to ground by being short circuited with the word line (i.e., coupled to ground). Thus, although the NMOS bleeder devices 130 provide some current limiting effect where a digit line 123 and word line are short circuited, an alternative approach to limiting the current drawn from the DVC2 voltage supply 126 would still be desirable.

Figure 2:
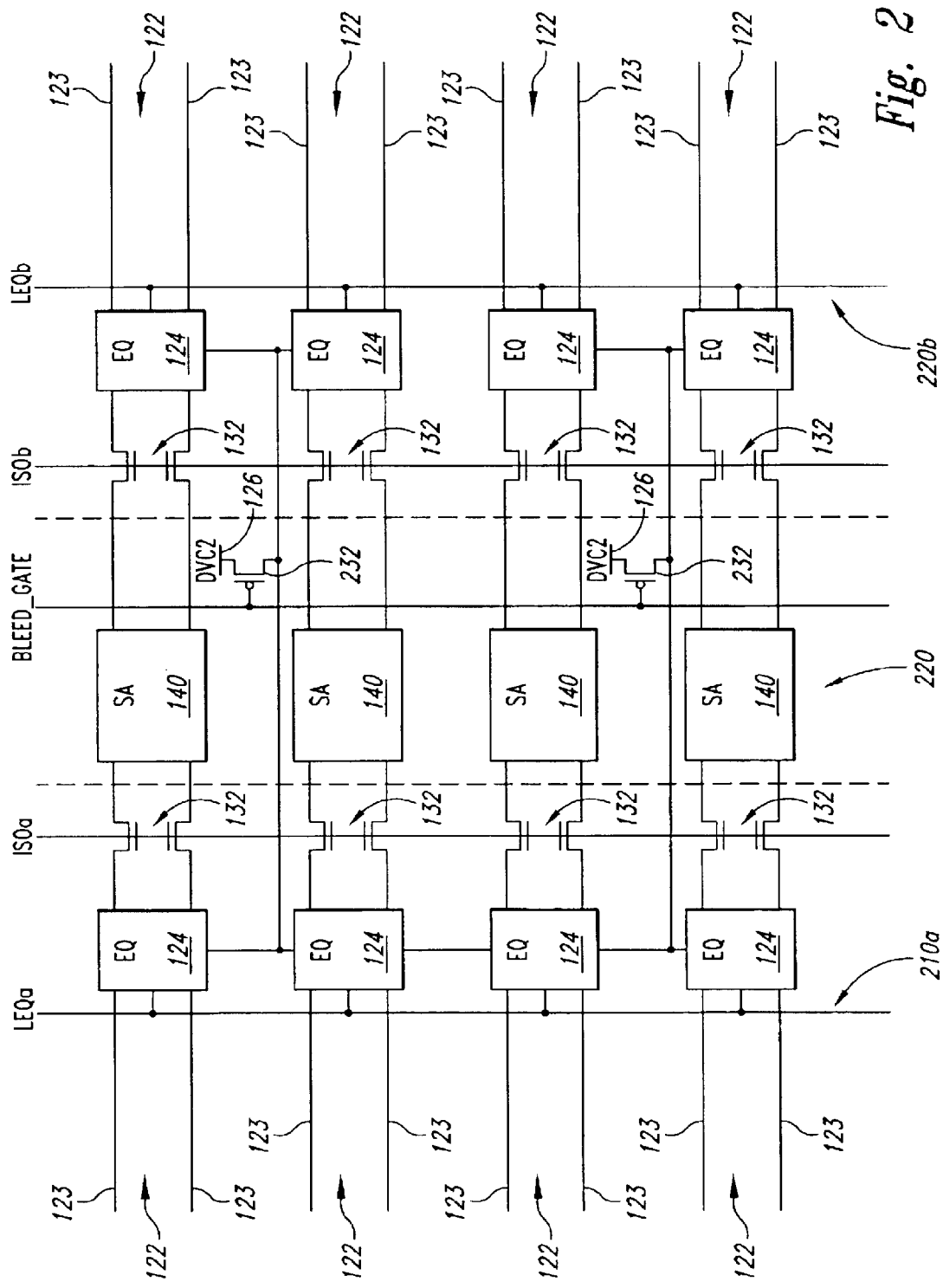
FIG. 2 is a simplified block diagram showing portions of a sense amplifier region and memory array regions of a memory device according to embodiments of the present invention.

FIG. 2 illustrates portions of a sense amplifier region 220 and memory array regions 210a, 210b according to an embodiment of the present invention. In FIG. 2, like numerals describe substantially similar components as those previously described in FIG. 1. The sense amplifier region 220 is disposed between memory array regions 210a and 210b. As in FIG. 1, the portion of the memory array regions 210a, 210b illustrated in FIG. 2 include equilibration circuits 124 coupled to each pair of complementary digit lines 123 of a column 122. The equilibration circuits 124, as previously explained, precharge the respective digit lines 123 in response to active LEQa and LEQb signals. Further coupled to each of the complementary pairs of digit lines 123 are a pair of isolation transistors 132 that selectively couple and decouple the digit lines 123 of memory array regions 210a, 210b to sense amplifiers 140 that are formed in the sense amplifier region 220.

In contrast to FIG. 1, the embodiment shown in FIG. 2 utilizes p-channel MOS (PMOS) bleeder devices 232 formed in the sense amplifier region 220 to limit the current drawn from the DVC2 voltage supply 126 in the event a digit line 123 is short circuited to a word line. The bleeder devices 232 are controlled by a common control signal BLEED_GATE, and are activated in coordination with the activation of the equilibration circuits 124 precharge the digit lines 123 to the voltage level of the DVC2 voltage supply 126.

As previously discussed with respect to FIG. 1, current through an NMOS bleeder device 130 tends to increase as the square of the voltage as a digit line 123 short circuited to a word line is pulled to ground during the stand-by state. However, the PMOS bleeder devices 232 in the embodiment shown in FIG. 2 exhibit a saturating current characteristic under the same conditions. That is, whereas with an NMOS bleeder device 130 both the gate-source and drain-source voltages increase as the digit line 123 is pulled to ground, thus, exponentially increasing the current, the gate-source voltage (i.e., the gate tied to a LOW BLEED_GATE signal, and the source tied to the DVC2 voltage supply 126) is constant for a PMOS bleeder device 232. As a result, as the drain-source voltage increases by the digit line 123 being pulled to ground, the drain-source current of the PMOS bleeder device 232 saturates, and consequently, limits the current load on the DVC2 voltage supply 126.

Additionally, in the embodiment of the present invention shown in FIG. 2, the bleeder devices 232 are shared between columns 122 of the two memory array regions 210a, 210b. Consequently, the number of bleeder devices 232 on a memory device can be reduced as compared to the arrangement shown in FIG. 1. Moreover, sharing the bleeder devices 232 between a plurality of memory array regions 210a, 210b, reduces the number of control lines necessary to operate the bleeder devices 232. Although not shown, those ordinarily skilled in the art will appreciate that reducing the number of bleeder devices 232 and bleeder control lines will simplify the layout of the sense amplifier region 220 and memory array regions 210a, 210b. As a result, many advantages can be provided by embodiments of the present invention. For example, metal interconnections formed for the circuitry previously described, such as the bleeder devices 232 and the BLEED_GATE line, can be localized in a particular region rather than extending over several memory array regions 210a, 210b and sense amplifier regions 220. Additionally, rearrangement of the layout of some metal interconnections allows for rerouting of other signal lines as well. For example, localization of the bleeder control lines may allow for these lines to be formed from a lower metal interconnection level, and consequently, provide greater flexibility for routing other signal lines through the sense amplifier region on another metal interconnection level, thus, avoiding the need to connect to another metal interconnection layer through vias formed in a dielectric interlayer. As appreciated by those of ordinary skill in the art, jumping metal interconnections from one metallization layer to another increases the impedance of the signal line, and consequently, introduces signal timing and speed issues that affect the overall performance of the memory device.

Figure 3:
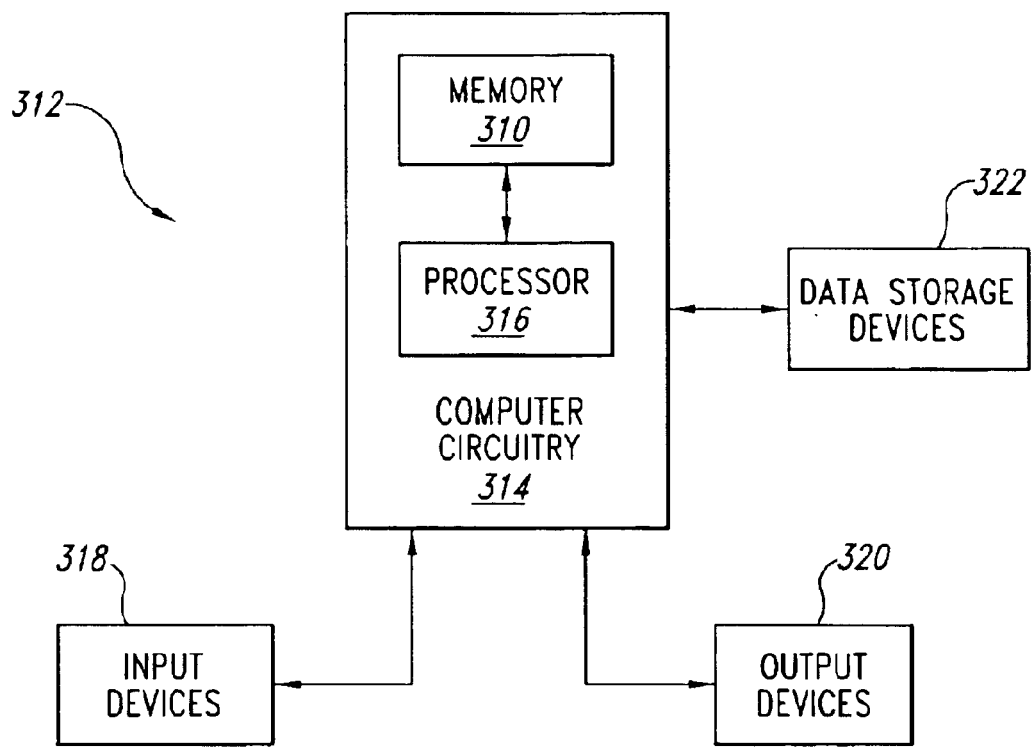
FIG. 3 is a functional block diagram of a computer system including a memory device according to an embodiment of the present invention.

FIG. 3 is a block diagram of an electronic system 312, such as a computer system, that incorporates a memory device 310 according to an embodiment of the present invention. The system 312 also includes computer circuitry 314 for performing computer functions, such as executing software to perform desired calculations and tasks. The circuitry 314 typically includes a processor 316 and the memory circuit 310, which is coupled to the processor 316. One or more input devices 318, such as a keyboard or a mouse, are coupled to the computer circuitry 314 and allow an operator (not shown) to manually input data thereto. One or more output devices 320 are coupled to the computer circuitry 314 to provide to the operator data generated by the computer circuitry 314. Examples of such output devices 320 include a printer and a video display unit. One or more data-storage devices 322 are coupled to the computer circuitry 314 to store data on or retrieve data from external storage media (not shown). Examples of the storage devices 322 and the corresponding storage media include drives that accept hard and floppy disks, tape cassettes, and compact disk read-only memories (CD-ROMs). Typically, the computer circuitry 314 includes address data and command buses and a clock line that are respectively coupled to the ADDRESS, DATA, and COMMAND buses, and the CLK line of the memory device 310.

From the foregoing it will be appreciated that, although specific embodiments of the invention have been described herein for purposes of illustration, various modifications may be made without deviating from the spirit and scope of the invention. For example, the previously described embodiment of the present invention includes bleeder devices 232 formed in the sense amplifier region 220. However, it will be appreciated that a bleeder device 232 shared between columns 122 of different memory array regions 210a, 210b can be formed in a region other than the sense amplifier region 220 without departing from the scope of the present invention. Moreover, the bleeder device 232 has been described in a specific embodiment as being a PMOS transistor. It will be appreciated by those of ordinary skill in the art that other current limiting devices can be used as well without departing from the scope of the present invention. Accordingly, the invention is not limited except as by the appended claims.

What is claimed is:

1. A memory device, comprising:
   a first memory array having memory cells arranged in a plurality of first rows and a plurality of first columns, each of the first columns having a respective first equilibration circuit to precharge the respective first column;
   a second memory array having memory cells arranged in a plurality of second rows and a plurality of second columns, each of the second columns having a respective second equilibration circuit to precharge the respective second column; and a bleeder device coupled to a precharge voltage supply and further coupled to at least one first equilibration circuit and further coupled to at least one second equilibration circuit, the bleeder device limiting the current drawn by the first and second equilibration circuits from the precharge voltage supply.

2. The memory device of claim 1 wherein the at least one first equilibration circuit coupled to a first column of the first memory array comprises first and second equilibration circuits coupled to first and second columns of the first memory array, respectively, and the at least one second equilibration circuit coupled to a second column of the second memory array comprises first and second equilibration circuits coupled to first and second columns of the second memory array, respectively.

3. The memory device of claim 1 wherein the bleeder device comprises a p-channel MOS transistor.

4. The memory device of claim 1 wherein the bleeder device comprises a transistor exhibiting a saturating current characteristic as the voltage across the transistor increases.

5. The memory device of claim 1 wherein the precharge voltage supply comprises a voltage supply having a voltage equal to one-half of a power supply voltage.

6. The memory device of claim 1, further comprising a sense amplifier region disposed between the first and second memory arrays in which sense amplifiers are formed, and wherein the bleeder device is also formed in the sense amplifier region.

7. A memory device, comprising:

a first memory array having memory cells arranged in rows and columns, each of the columns of the first memory array having a equilibration circuit;

a second memory array having memory cells arranged in rows and columns, each of the columns of the second memory array having a equilibration circuit;

a sense amplifier region having a plurality of sense amplifiers formed therein, each sense amplifier coupled to a respective column of the first memory array and further coupled to a respective column of the second memory array; and a bleeder device formed in the sense amplifier region, and coupled to a precharge voltage supply and to the equilibration circuits of a column of the first memory array and a column of the second memory array, the columns of the first and second memory arrays coupled to the same sense amplifier.

8. The memory device of claim 7 wherein the columns of the first and second memory arrays comprise first columns and the bleeder device is further coupled to the equilibration circuits of a second column of the first memory array and a second column of the second memory array, the second columns of the first and second memory arrays coupled to the same sense amplifier.

9. The memory device of claim 7 wherein the bleeder device comprises a p-channel MOS transistor.

10. The memory device of claim 7 wherein the bleeder device comprises a transistor exhibiting a saturating current characteristic as the voltage across the transistor increases.

11. The memory device of claim 7 wherein the precharge voltage supply comprises a voltage supply having a voltage equal to one-half of a power supply voltage.

12. A memory device having memory cells arranged in rows and columns of memory cells, each column having an equilibration circuit for precharging the respective column, the memory device comprising a sense amplifier region having a plurality of sense amplifiers, each sense amplifier coupled to a respective one of a first plurality of columns of memory cells through a respective first isolation switch and further coupled to a respective one of a second plurality of columns of memory cells through a respective second isolation switch, the sense amplifier region further having a plurality of bleeder devices, each of the bleeder devices coupled to a precharge voltage supply and at least one equilibration circuit coupled to a column of the first plurality of columns and to at least one equilibration circuit coupled to a column of the second plurality of columns to limit current drawn by the respective equilibration circuits.

13. The memory device of claim 12 wherein the plurality of bleeder devices comprises a plurality of p-channel MOS transistors.

14. The memory device of claim 12 wherein the precharge voltage supply comprises a voltage supply having a voltage equal to one-half a power supply voltage.

15. The memory device of claim 12 wherein the plurality of bleeder devices comprises a plurality of transistors, each transistor exhibiting a saturating current characteristic as the voltage across the transistor increases.

16. The memory device of claim 12 wherein the at least one equilibration circuit coupled to a column of the first plurality of columns comprises first and second equilibration circuits coupled to first and second columns of the first plurality of columns, respectively, and the at least one equilibration circuit coupled to a column of the second plurality of columns comprises first and second equilibration circuits coupled to first and second columns of the second plurality of columns, respectively.

17. A memory device, comprising:

a first memory array region having formed therein memory cells arranged in rows and columns, each of the columns coupled to a respective equilibration circuit also formed in the first memory array region;

a second memory array region having formed therein memory cells arranged in rows and columns, each of the columns coupled to a respective equilibration circuit also formed in the second memory array region;

a sense amplifier region having formed therein sense amplifiers and a plurality of bleeder devices, each bleeder device coupled to a precharge voltage supply and further coupled to at least one equilibration circuit formed in the first memory array region and to at least one equilibration circuit formed in the second memory array region; and first and second plurality of isolation switches coupling each of the sense amplifiers formed in the sense amplifier region to respective a column of memory cells from the first memory array and to a respective column of memory cells from the second memory array.

18. The memory device of claim 17 wherein the at least one equilibration circuit formed in the first memory array region comprises first and second equilibration circuits formed in the first memory array region, and the at least one equilibration circuit formed in the second memory array region comprises first and second equilibration circuits formed in the second memory array region.

19. The memory device of claim 17 wherein the plurality of bleeder devices comprise a plurality of p-channel MOS transistors.

20. The memory device of claim 17 wherein the plurality of bleeder devices comprises a plurality of transistors, each transistor exhibiting a saturating current characteristic as the voltage across the transistor increases.

21. The memory device of claim 17 wherein the precharge voltage supply comprises a voltage supply having a voltage equal to one-half of a power supply voltage.

22. A computer system, comprising:
    a processor having a processor bus;
    an input device coupled to the processor through the processor bus and adapted to allow data to be entered into the computer system;
    an output device coupled to the processor through the processor bus and adapted to allow data to be output from the computer system; and
    a memory device coupled to the processor through the processor bus, the memory device having memory cells arranged in rows and columns of memory cells, each column having an equilibration circuit for precharging the respective column, the memory device comprising a sense amplifier region having a plurality of sense amplifiers, each sense amplifier coupled to a respective one of a first plurality of columns of memory cells through a respective first isolation switch and further coupled to a respective one of a second plurality of columns of memory cells through a respective second isolation switch, the sense amplifier region further having a plurality of bleeder devices, each of the bleeder devices coupled to a precharge voltage supply and at to least one equilibration circuit coupled to a column of the first plurality of columns and to at least one equilibration circuit coupled to a column of the second plurality of columns to limit current drawn by the respective equilibration circuits.

23. The computer system of claim 22 wherein the plurality of bleeder devices of the memory device comprises a plurality of p-channel MOS transistors.

24. The computer system of claim 22 wherein the precharge voltage supply of the memory device comprises a voltage supply having a voltage equal to one-half a power supply voltage.

25. The computer system of claim 22 wherein the plurality of bleeder devices of the memory device comprises a plurality of transistors, each transistor exhibiting a saturating current characteristic as the voltage across the transistor increases.

26. The computer system of claim 22 wherein the at least one equilibration circuit coupled to a column of the first plurality of columns comprises first and second equilibration circuits coupled to first and second columns of the first plurality of columns, respectively, and the at least one equilibration circuit coupled to a column of the second plurality of columns comprises first and second equilibration circuits coupled to first and second columns of the second plurality of columns, respectively.

27. A computer system, comprising:
    a processor having a processor bus;
    an input device coupled to the processor through the processor bus and adapted to allow data to be entered into the computer system;
    an output device coupled to the processor through the processor bus and adapted to allow data to be output from the computer system; and
    a memory device coupled to the processor through the processor bus, the memory device comprising:
        a first memory array having memory cells arranged in a plurality of first rows and a plurality of first columns, each of the first columns having a respective first equilibration circuit to precharge the respective first column;
        a second memory array having memory cells arranged in a plurality of second rows and a plurality of second columns, each of the second columns having a respective second equilibration circuit to precharge the respective second column; and
        a bleeder device coupled to a precharge voltage supply and further coupled to at least one first equilibration circuit and to at least one second equilibration circuit, the bleeder device limiting the current drawn by the first and second equilibration circuits from the precharge voltage supply.

28. The computer system of claim 27 wherein the at least one first equilibration circuit coupled to a column of the first memory array comprises first and second equilibration circuits coupled to first and second columns of the first memory array, respectively, and the at least one second equilibration circuit coupled to a column of the second memory array comprises first and second equilibration circuits coupled to first and second columns of the second memory array, respectively.

29. The computer system of claim 27 wherein the bleeder device of the memory device comprises a p-channel MOS transistor.

30. The computer system of claim 27 wherein the bleeder device of the memory device comprises a transistor exhibiting a saturating current characteristic as the voltage across the transistor increases.

31. The computer system of claim 27 wherein the precharge voltage supply o the memory device comprises a voltage supply having a voltage equal to one-half of a power supply voltage.

32. In a memory device having a plurality of memory arrays in which memory cells are arranged in rows and columns of memory cells, each column coupled to respective equilibration circuit, a method for limiting current to the equilibration circuits, comprising:
    forming a sense amplifier region disposed between a first of the plurality of memory arrays and second of the plurality of memory arrays in which sense amplifiers are formed for amplifying data states stored by the memory cells of the first and second memory arrays; and
    forming a plurality of bleeder devices in the sense amplifier region coupled to a precharge voltage supply, each of the bleeder devices further coupled to at least one first equilibration circuit coupled to a column of memory cells in the first memory array and to at least one second equilibration circuit coupled to a column of memory cells in the second memory array.

33. The method of claim 32 wherein forming a plurality of bleeder devices comprises forming a plurality of p-channel MOS transistors.

34. The method of claim 32 wherein forming a plurality of bleeder devices comprises forming a plurality of transistors, each transistor exhibiting a saturating current characteristic as the voltage across the transistor increases.

35. In a memory device having a plurality of memory arrays in which memory cells are arranged in rows and columns of memory cells, each column coupled to a respective equilibration circuit, a method for limiting current to the equilibration circuits, comprising:
    forming a sense amplifier region disposed between a first of the plurality of memory arrays and second of the plurality of memory arrays in which sense amplifiers are formed for amplifying data states stored by the memory cells of the first and second memory arrays; and sharing a current limiting bleeder device coupled to a precharge voltage supply between at least one equilibration circuit coupled to a column of memory cells in the first memory array and at least one equilibration circuit coupled to a column of memory cells in the second memory array.

36. The method of claim 35 wherein sharing the current limiting bleeder device comprises sharing a p-channel MOS transistor.

37. The method of claim 35 wherein sharing the current limiting bleeder device comprises sharing a transistor exhibiting a saturating current characteristic as the voltage across the transistor increases.

38. In a memory device having a plurality of memory arrays in which memory cells are arranged in rows and columns of memory cells, each column coupled to respective equilibration circuit, a method for limiting current to the equilibration circuits, comprising:

forming a sense amplifier region disposed between a first of the plurality of memory arrays and second of the plurality of memory arrays in which sense amplifiers are formed for amplifying data states stored by the memory cells of the first and second memory arrays; and limiting current drawn by the equilibration circuits of the first and second memory arrays through a shared current limiting bleeder device formed in the sense amplifier region and coupled to a precharge voltage supply.

39. A method for forming a memory device, comprising:

forming a first memory array having memory cells arranged in rows and columns, each of the columns having a equilibration circuit;

forming a second memory array having memory cells arranged in rows and columns, each of the columns having a equilibration circuit;

forming a sense amplifier region having a plurality of sense amplifiers formed therein, each sense amplifier coupled to a respective column of the first memory array and further coupled to a respective column of the second memory array; and forming a bleeder device in the sense amplifier region coupled to a precharge voltage supply and coupling the bleeder device to the equilibration circuits of a column of the first memory array and a column of the second memory array, the columns of the first and second memory arrays coupled to the same sense amplifier.

40. The method of claim 39 wherein forming a bleeder device in the sense amplifier region comprises forming a p-channel MOS transistor in the sense amplifier region.

41. The method of claim 39 wherein forming a bleeder device in the sense amplifier region comprises forming a transistor in the sense amplifier region exhibiting a saturating current characteristic as the voltage across the transistor increases.

* * * * *

UNITED STATES PATENT AND TRADEMARK OFFICE
CERTIFICATE OF CORRECTION

PATENT NO. : 6,934,208 B2
APPLICATION NO. : 10/309572
DATED : August 23, 2005
INVENTOR(S) : J. Wayne Thompson, George B. Raad and Howard C. Kirsch It is certified that error appears in the above-identified patent and that said Letters Patent is hereby corrected as shown below:

| Column, Line | Reads | Should Read |
|---|---|---|
| Item (73) | "Assignee: Boise Technology, Inc., Boise, ID (US)" | --Assignee: Micron Technology, Inc., Boise, ID (US)-- |
| Item (57), Line 8 | "have a equilibration circuit" | --have an equilibration circuit-- |
| Column 3, Line 30 | "memory device having" | --a memory device having-- |
| Column 5, Line 30 | "circuits 124 precharge the" | --circuits 124 to precharge the-- |
| Column 7, Lines 35 and 39 | "having a equilibration circuit;" | --having an equilibration circuit;-- |
| Column 8, Line 10 | "and at least one" | --and to at least one-- |
| Column 8, Line 51 | "region to respective a column" | --region to a respective column-- |
| Column 9, Line 27 | "and at to least one" | --and to at least one-- |
| Column 10, Line 29 | "voltage supply o the memory device" | --voltage supply of the memory device-- |
| Colum 10, Line 34 | "coupled to respec-" | --coupled to a respec- -- |
| Column 11, Line 16 | "coupled to respec-" | --coupled to respec- -- |

UNITED STATES PATENT AND TRADEMARK OFFICE
CERTIFICATE OF CORRECTION

PATENT NO. : 6,934,208 B2
APPLICATION NO. : 10/309572
DATED : August 23, 2005
INVENTOR(S) : J. Wayne Thompson, George B. Raad and Howard C. Kirsch It is certified that error appears in the above-identified patent and that said Letters Patent is hereby corrected as shown below:

| Column, Line | Reads | Should Read |
|---|---|---|
| Column 12, Lines 4 and 7 | "having a equilibration" | --having an equilibration-- |

Signed and Sealed this

Twenty-third Day of October, 2007

JON W. DUDAS
*Director of the United States Patent and Trademark Office*